US012694186B1

(12) United States Patent (10) Patent No.: US 12,694,186 B1
Ghillino (45) Date of Patent: Jul. 28, 2026

(54) MODIFYING THE TOPOLOGY OF CIRCUITS CONTAINING MIXED SIGNAL SUBCIRCUITS TO ENABLE ELECTRO-OPTICAL CO-SIMULATION

(71) Applicant: Synopsys, Inc., Sunnyvale, CA (US)

(72) Inventor: Enrico Ghillino, New York, NY (US)

(73) Assignee: Synopsys, Inc., Sunnyvale, CA (US)

( * ) Notice: Subject to any disclaimer, the term of this patent is extended or adjusted under 35 U.S.C. 154(b) by 676 days.

(21) Appl. No.: 18/204,041

(22) Filed: May 31, 2023

Related U.S. Application Data

(60) Provisional application No. 63/348,863, filed on Jun. 3, 2022.

(51) Int. Cl.
    *G06F 30/367*     (2020.01)
    *G06F 30/3308*     (2020.01)
    *G06F 30/38*     (2020.01)

(52) U.S. Cl.
    CPC .......... *G06F 30/38* (2020.01); *G06F 30/3308* (2020.01); *G06F 30/367* (2020.01)

(58) Field of Classification Search
    CPC ..... G06F 30/38; G06F 30/3308; G06F 30/367
    See application file for complete search history.

(56) References Cited

U.S. PATENT DOCUMENTS

| | | | | |
|---|---|---|---|---|
| 10,997,332 | B1 * | 5/2021 | Kukal | G06F 30/392 |
| 11,334,702 | B1 * | 5/2022 | Banerjee | G06F 30/367 |

* cited by examiner

*Primary Examiner* — Nghia M Doan
(74) *Attorney, Agent, or Firm* — Weaver Austin Villeneuve & Sampson LLP

(57) ABSTRACT

A method of simulating a mixed-signal circuit design, includes, dividing a first circuit disposed in a first level of hierarchy of the circuit design into a multitude of subcircuits. At least a first subcircuit processes an electrical signal, and at a least a second subcircuit processes an optical signal; adding one or more input/output terminals to the first subcircuit to transform the subcircuit into a first subblock; adding one or more input/output terminals to the second subcircuit to transform the second subcircuit into a second subblock; replacing an instance of the first circuit design in a second level of hierarchy of the mixed-signal design with the first and second subblocks; simulating the first subblock in each of the first and second levels of the hierarchy using an electrical circuit simulator; and simulating the second subblock in each of the first and second levels of the hierarchy using an optical simulator.

20 Claims, 6 Drawing Sheets

MODIFYING THE TOPOLOGY OF CIRCUITS CONTAINING MIXED SIGNAL SUBCIRCUITS TO ENABLE ELECTRO-OPTICAL CO-SIMULATION

RELATED APPLICATION

The present application claims benefit under 35 USC 119 (e) of U.S. patent application No. 63/348,863, filed Jun. 3, 2022, the content of which is incorporated herein by reference in its entirety.

TECHNICAL FIELD

The present disclosure relates to simulation of circuits, and more particularly to simulation of mixed-signal opto-electronics circuits.

BACKGROUND

A circuit that includes both digital circuit blocks and analog circuit blocks may be simulated using a mixed-mode simulator in which the analog circuit blocks are simulated by an analog circuit simulator, such as SPICE, and the digital circuit blocks are simulated by a digital circuit simulator, such as Verilog. An interface between the digital circuit simulator and the analog circuit simulator is often used to convert the analog signals to corresponding digital signals, and vice versa.

High speed communication and control systems are increasingly using optical circuits and/or components (collectively referred to herein as circuits) to improve the communication speed and efficiency. Photonic integrated circuits (PICs) are becoming more important as they leverage the capabilities of monolithic integration processing technologies, such as reduced size, low unit cost, and large scale, to perform complex photonic functions. Often a PIC includes both electrical and photonic components requiring processing of signals in both electrical and optical domains.

SUMMARY

A method of simulating a mixed-signal circuit design, in accordance with one embodiment of the present disclosure, includes, in part, dividing a first circuit design disposed in a first level of hierarchy of the mixed-signal circuit design into a multitude of subcircuits, wherein at least a first one of the multitude of subcircuits is adapted to process an electrical signal, and at a least a second one of the multitude of subcircuits is adapted to process an optical signal; adding one or more input/output terminals to the first one of the multitude of subcircuits to transform the first one of the multitude of subcircuits into a first subblock; adding one or more input/output terminals to the second one of the multitude of subcircuits to transform the second one of the multitude of subcircuits into a second subblock; replacing, by a processing device, an instance of the first circuit design in a second level of hierarchy of the mixed-signal circuit design with the first and second subblocks; performing a simulation of the first subblock associated with each of the first and second levels of the hierarchy using an electrical circuit simulator; and performing a simulation of the second subblock associated with each of the first and second levels of the hierarchy using an optical circuit simulator.

In accordance with one embodiment, at least a third one of the multitude of subcircuits of the first level of hierarchy is adapted to process an optical signal. In such embodiments, the method further includes, in part, disposing the third one of the multitude of subcircuits in the second subblock of the first level of hierarchy. In one embodiment, the first one of the multitude of subcircuits is adapted to process an analog electrical signal. In such embodiments, the method further includes, in part, performing the simulation of the first subblock associated with each of the first and second levels of the hierarchy using an analog circuit simulator.

In one embodiment, the first one of the multitude of subcircuits is adapted to process a digital electrical signal. In such embodiments, the method further includes, in part, performing the simulation of the first subblock associated with each of the first and second levels of the hierarchy using a digital circuit simulator.

In one embodiment, the first one of the multitude of subcircuits is adapted to process an analog electrical signal, and wherein a third one of the multitude of subcircuits is adapted to process a digital electrical signal. In such embodiments, the method further includes, in part, adding one or more input/output terminals to the third one of the multitude of subcircuits to transform the third one of the multitude of subcircuits into a third subblock; replacing an instance of the first circuit design in a third level of hierarchy of the mixed-signal circuit design with the first, second and third subblocks; performing a simulation of the first subblock associated with each of the first and third levels of the hierarchy using an analog circuit simulator; performing a simulation of the second subblock associated with each of the first and third levels of the hierarchy using an optical circuit simulator; and performing a simulation of the third subblock in each of the first and third levels of the hierarchy using a digital circuit simulator.

In one embodiment, the method further includes, in part, traversing through the hierarchy of the mixed-signal circuit design in a descending order to perform the replacing. In one embodiment, the first level of hierarchy is a highest level of the hierarchy of the mixed-signal circuit design.

A system for simulating a mixed-signal circuit design comprising, in accordance with one embodiment of the present disclosure, includes, in part, a memory storing instructions; and a processor, coupled with the memory and to execute the instructions. The instructions when executed cause the processor to: divide a first circuit design disposed in a first level of hierarchy of the mixed-signal circuit design into a multitude of subcircuits, wherein at least a first one of the multitude of subcircuits is adapted to process an electrical signal, and at a least a second one of the multitude of subcircuits is adapted to process an optical signal; add one or more input/output terminals to the first one of the multitude of subcircuits to transform the first one of the multitude of subcircuits into a first subblock; add one or more input/output terminals to the second one of the multitude of subcircuits to transform the second one of the multitude of subcircuits into a second subblock; replace an instance of the first circuit design in a second level of hierarchy of the mixed-signal circuit design with the first and second subblocks; perform a simulation of the first subblock associated with each of the first and second levels of the hierarchy using an electrical circuit simulator; and perform a simulation of the second subblock associated with each of the first and second levels of the hierarchy using an optical circuit simulator.

In one embodiment, at least a third one of the multitude of subcircuits of the first level of hierarchy is adapted to process an optical signal. In such embodiments, the instructions further cause the processor to dispose the third one of the multitude of subcircuits in the second subblock of the first level of hierarchy.

In one embodiment, the first one of the multitude of subcircuits is adapted to process an analog electrical signal. In such embodiments, the instructions further cause the processor to perform the simulation of the first subblock associated with each of the first and second levels of the hierarchy using an analog circuit simulator. In one embodiment, the first one of the multitude of subcircuits is adapted to process a digital electrical signal. In such embodiments, the instructions further cause the processor to perform the simulation of the first subblock associated with each of the first and second levels of the hierarchy using a digital circuit simulator.

In one embodiment, the first one of the multitude of subcircuits is adapted to process an analog electrical signal, and a third one of the plurality of subcircuits is adapted to process a digital electrical signal. In such embodiments, the instructions further cause the processor to: add one or more input/output terminal to the third one of the multitude of subcircuits to transform the third one of the multitude of subcircuits into a third subblock; replace an instance of the first circuit design in a third level of hierarchy of the mixed-signal circuit design with the first, second and third subblocks; perform a simulation of the first subblock associated with each of the first and third levels of the hierarchy using an analog circuit simulator; perform a simulation of the second subblock associated with each of the first and third levels of the hierarchy using an optical circuit simulator; and perform a simulation of the third subblock in each of the first and third levels of the hierarchy using a digital circuit simulator.

In one embodiment, the instructions further cause the processor to traverse through the hierarchy of the mixed-signal circuit design in a descending order to perform the replacement. In one embodiment, the first level of hierarchy is a highest level of the hierarchy of the mixed-signal circuit design.

A non-transitory computer readable medium includes, in part, stored instructions, which when executed by a processor, cause the processor to: divide a first circuit design disposed in a first level of hierarchy of the mixed-signal circuit design into a multitude of subcircuits, wherein at least a first one of the multitude of subcircuits is adapted to process an electrical signal, and at least a second one of the multitude of subcircuits is adapted to process an optical signal; add one or more input/output terminals to the first one of the multitude of subcircuits to transform the first one of the multitude of subcircuits into a first subblock; add one or more input/output terminals to the second one of the multitude of subcircuits to transform the second one of the multitude of subcircuits into a second subblock; replace an instance of the first circuit design in a second level of hierarchy of the mixed-signal circuit design with the first and second subblocks; perform a simulation of the first subblock associated with each of the first and second levels of the hierarchy using an electrical circuit simulator; and perform a simulation of the second subblock associated with each of the first and second levels of the hierarchy using an optical circuit simulator.

In one embodiment, at least a third one of the multitude of subcircuits of the first level of hierarchy is adapted to process an optical signal. In such embodiments, the instructions further cause the processor to dispose the third one of the multitude of subcircuits in the second subblock of the first level of hierarchy.

4

In one embodiment, the first one of the multitude of subcircuits is adapted to process an analog electrical signal. In such embodiments, the instructions further cause the processor to perform the simulation of the first subblock associated with each of the first and second levels of the hierarchy using an analog circuit simulator. In one embodiment, the first one of the multitude of subcircuits is adapted to process a digital electrical signal, In such embodiments the instructions further cause the processor to perform the simulation of the first subblock associated with each of the first and second levels of the hierarchy using a digital circuit simulator.

In one embodiment, the first one of the multitude of subcircuits is adapted to process an analog electrical signal, and a third one of the multitude of subcircuits is adapted to process a digital electrical signal. In such embodiments, the instructions further cause the processor to: add one or more input/output terminal to the third one of the multitude of subcircuits to transform the third one of the multitude of subcircuits into a third subblock; replace an instance of the first circuit design in a third level of hierarchy of the mixed-signal circuit design with the first, second and third subblocks; perform a simulation of the first subblock associated with each of the first and third levels of the hierarchy using an analog circuit simulator; perform a simulation of the second subblock associated with each of the first and third levels of the hierarchy using an optical circuit simulator; and perform a simulation of the third subblock in each of the first and third levels of the hierarchy using a digital circuit simulator. In one embodiment, the instructions further cause the processor to: traverse through the hierarchy of the mixed-signal circuit design in a descending order to perform the replacement.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figures 1A, 1B, 1C, 2A, 2B, 2C:
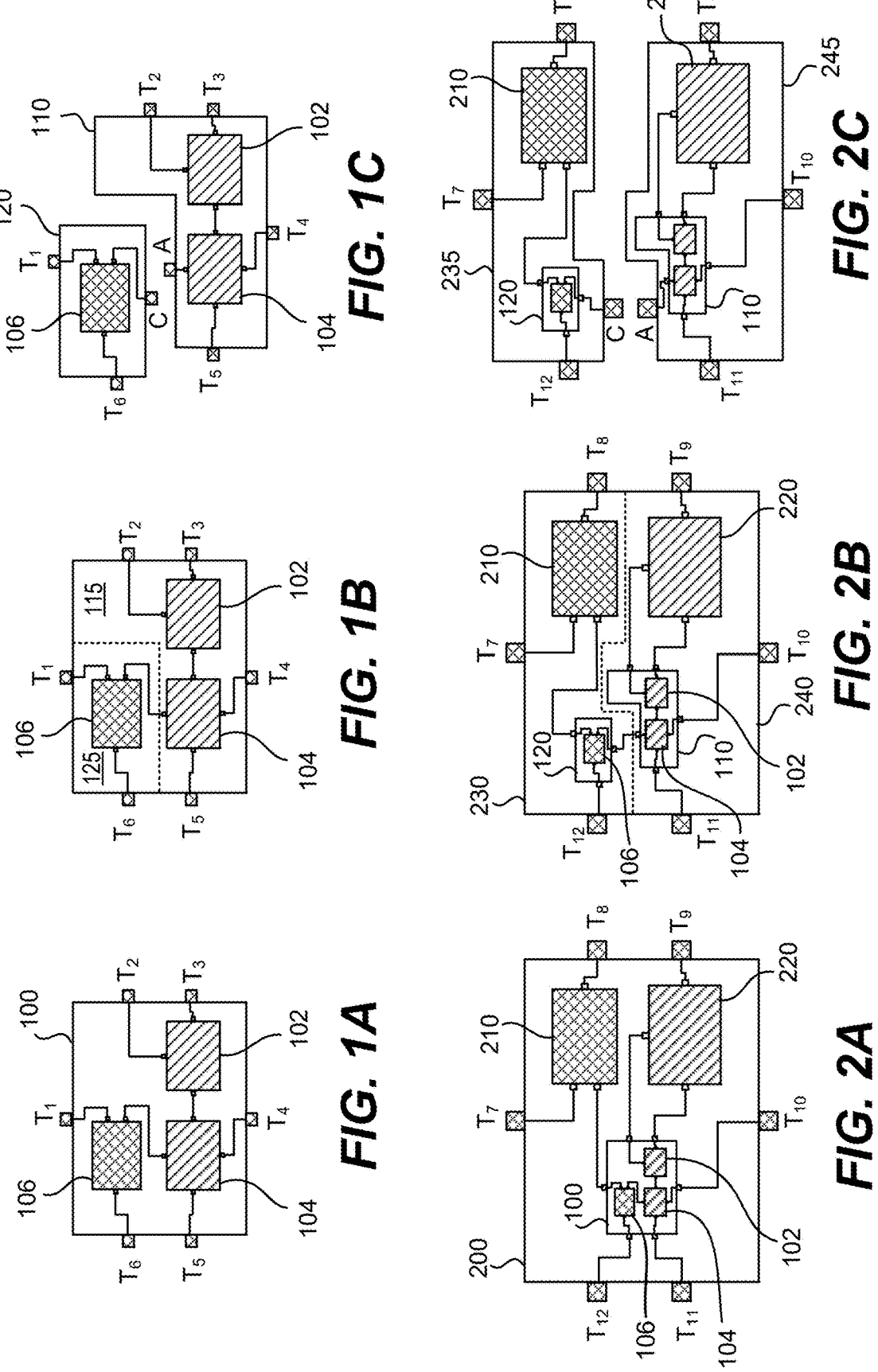
FIG. 1A shows an example of a circuit disposed at a level of a design hierarchy, in accordance with one embodiment of the present disclosure.
FIG. 1B shows the circuit of FIG. 1A after the circuit is divided into a number of subcircuits, in accordance with one embodiment of the present disclosure.
FIG. 1C shows the subcircuits of FIG. 1B after the subcircuits are transformed into instantiable design subblocks, in accordance with one embodiment of the present disclosure
FIG. 2A shows an example of a circuit disposed at another level of a design hierarchy, in accordance with one embodiment of the present disclosure.
FIG. 2B shows the circuit of FIG. 2A after the circuit is divided into a number of subcircuits, in accordance with one embodiment of the present disclosure.
FIG. 2C shows the subcircuits of FIG. 2B after the subcircuits are transformed into instantiable design subblocks, in accordance with one embodiment of the present disclosure.

The presence of digital, analog and optical circuit blocks (also referred to herein as subcircuits or circuits) at various levels of an opto-electronic circuit design hierarchy complicates the computer simulation of the opto-electronic circuit design to verify its functionality. The various subcircuits of the opto-electronic circuit design may be separated based on their electrical signal characteristics (i.e., digital or analog) as well as their optical signal characteristics after the netlist associated with the opto-electronic circuit design is generated. However, separating the subcircuits of an opto-electronic circuit design after its associated netlist is generated, is time consuming, tedious, prone to error and inefficient. Embodiments of the present disclosure overcome the above problems by automating the process of separating various subcircuits of an opto-electronic circuit design based on the type of circuit simulator used to simulate each subcircuit, as described further below, thereby improving efficiency, lowering the risk of error and the cost associated with the simulation of the opto-electronic circuit design.

Embodiments of the present disclosure modify circuits that include mixed signal subcircuits by separating the subcircuits in accordance with the type of signals they process, or alternatively in accordance with the model used to represent the subcircuits. For example, an amplifier may be simulated using an analog circuit simulator when the amplifier is represented by transistors and other circuit elements, such as capacitors. Alternatively, the amplifier may be modeled and represented as a gain stage, in which case the amplifier may be simulated using a simulator that generates an output value defined by an input value and the amplifier gain. Accordingly, embodiments of the present disclosure may be used to enable electro-optical co-simulation with domain specific simulators. The circuit modifications depend on the mixed netlist instances and connections, and not just on the initial mixed subcircuits, as described further below.

Embodiments of the present disclosure achieve a number of technical advantages. Among such advantages are an efficient circuit simulation that (i) minimizes the topological modifications and their attendant parameter evaluations to achieve separation in subcircuits of a given type (e.g., analog, digital, optical), (ii) improves efficiency, and (iii) lowers the risk of error when dividing the netlist. Moreover, because the simulations are performed using domain specific simulators, the simulations are optimized to use fewer computer resources, thereby lowering the overall cost associated with the simulation of the circuit design.

In one embodiment, a circuit design is traversed from the highest level of hierarchy to the lowest level of hierarchy, in a descending order, where only instantiable subcircuits of a given design type (i.e., digital electronic subcircuits, analog electronic subcircuits, or optical subcircuits) are present. Accordingly, no subcircuit call instances are present at the lowest level of a design hierarchy.

As described further below, internal partitions (not connected to pins) float to the top of the hierarchy as single element partial subcircuit call instances and are wrapped by as many partial subcircuits as the partition hierarchy level. If the target simulator uses a secondary closed form method (e.g., linear time-invariant (LTI)) that can resolve the subcircuit environment parameters of the primary simulator (e.g. photonic) the instantiated partial subcircuit may be executed in a secondary simulation tool subsequent to which the instantiated partial circuit may be simulated using the primary simulation tool.

In accordance with one aspect of the present disclosure, a circuit disposed in any given hierarchy of a design is divided into multiple subcircuits while maintaining the original hierarchical structure of the design. The subcircuits at each level of hierarchy are determined in accordance with an attribute of the subcircuit, such as the circuit simulator type (i.e., digital circuit simulator, analog circuit simulator, or optical circuit simulator) used to simulate the subcircuits. Each subcircuit is then transformed so as to include input/output terminals while maintaining the original functionality of the subcircuit. Each transformed subcircuit may then be instantiated individually across the entire design hierarchy. The process of dividing a circuit at each level of hierarchy into a multitude of transformed and instantiable subcircuits is repeated until the circuit in its entire hierarchy is transformed to include the instantiable subcircuits.

For example, a circuit at any given level of hierarchy may be divided into a first subcircuit adapted to process optical signals, a second subcircuit adapted to process analog electrical signals, and a third subcircuit adapted to process digital electrical signals. Consequently, in one embodiment, the first subcircuit is considered an optical circuit and is, therefore, simulated using an optical circuit simulator. The second subcircuit is considered an analog electrical circuit and is, therefore, simulated using an analog circuit simulator. The third subcircuit is considered a digital electrical circuit and is, therefore, simulated using a digital circuit simulator. Each such subcircuit may then be transformed into an instantiable circuit block that includes input and output terminals.

In another embodiment, when, for example, a subcircuit is represented by a model that is different from the subcircuit as represented at its most elemental level, then the subcircuit is simulated using a simulator suited for simulating the model representation of the subcircuit. For example, consider an amplifier that, at its most elemental level, is represented by transistors and other circuit elements, such as capacitors. The amplifier, may therefore, be simulated using an analog simulator. However, if the amplifier is represented as a gain stage that receives an input signal and amplifies the input signal by the amplifier's gain, the amplifier may be simulated using a digital simulator-thus dispensing the need for a computationally intensive analog simulator that would otherwise require the detailed transistor circuitry of the amplifier.

In yet other embodiments, when a subcircuit includes, for example, a linear time-invariant (LTI) system represented by a function that can be solved in a closed form, the LTI system may be divided and represented as a separate subcircuit. Since the function represented by the LTI system can be solved in a closed form, the subcircuit representing the LTI system may not require detailed simulation, and thus its input/output characteristics may be determined by a relatively simple computation engine.

In accordance with one embodiment of the present disclosure, the design hierarchy is then traversed in an descending order. During the traversal and at any given level of the design hierarchy, any instance of a circuit that was divided earlier into multiple subcircuits at a higher level of hierarchy is replaced with its corresponding instantiable blocks. Furthermore, at any given level of the design hierarchy, a circuit that was not divided at a higher level of hierarchy and thus does not have associated instantiable blocks, may be divided into multiple subcircuits and transformed into corresponding instantiable circuit blocks for use at lower levels of the hierarchy, in the same manner as was described with reference to the circuits at higher levels of the hierarchy. This process continues until all circuits at all levels of the design hierarchy are replaced with their associated instantiable blocks.

FIG. 1A shows an example of a circuit 100 at a given level of a design hierarchy. Circuit 100 is shown as including three subcircuits 102, 104 and 106 that communicate with circuits in other levels of the design (not shown) via terminals $T_1$, $T_2$, $T_3$, $T_4$, $T_5$ and $T_6$. FIG. 1B shows circuit 100 after the circuit is divided into subcircuit design blocks (also referred to herein as subcircuits) 115 and 125 based, in this example, on the subcircuit block's electrical and/or optical characteristics defining whether each subcircuit design block is (i) an analog electrical circuit, (ii) a digital circuit, or (iii) an optical circuit. An analog electrical circuit may be simulated using an analog circuit simulator. A digital electrical circuit may be simulated using a digital circuit simulator. An optical circuit may be simulated using an optical simulator.

In the example shown in FIGS. 1A and 1B, subcircuits 102 and 104 may be analog subcircuits (e.g., phase locked loops, amplifiers, current mirrors), and subcircuit 106 may be an optical circuit (e.g., an optical modulator circuit). Because subcircuits 102 and 104 are both analog subcircuits, subcircuits 102 and 104 are grouped together form a first design block 115. Subcircuit 106, which is an optical circuit, forms a second design block 125.

FIG. 1C shows the circuit of FIG. 1B after design blocks 115 and 125 are transformed into instantiable design blocks 110 and 120, respectively. The transformations are achieved by adding terminal A to instantiable design block 110, and adding terminal C to instantiable design block 120. Instantiable design blocks 110 and 120 pass signals to one another, in part, via terminals A and C. Instantiable design block 110 is also shown as including terminals $T_2$, $T_3$, $T_4$, $T_5$, and instantiable design block 120 is also shown as including terminals $T_1$ and $T_6$. Although not shown, circuit 100 may include one or more digital subcircuits adapted to be simulated using a digital circuit simulator. In such a case, the digital subcircuits are grouped to form a separate digital design subblock in addition to design blocks 115 and 125. The digital design subblock is then transformed into an instantiable digital design block by including one or more terminals via which the instantiable digital design subblock delivers signals to or receives signals from instantiable design blocks 110 and 120.

FIG. 2A shows an exemplary circuit 200 disposed in another level of the design hierarchy of which circuit 100 is a part. Circuit 200 is shown as including subcircuits 210, 220, as well as subcircuit 100 which is an instance of circuit 100 described above with reference to FIG. 1A. Circuit 200 is also shown as including terminals $T_7$, $T_8$, $T_9$, $T_{10}$, $T_{11}$ and $T_{12}$. Because subcircuit 100 of circuit 200 is an instance of circuit 100, subcircuit 100 is shown in FIG. 2B as having been replaced by its respective subcircuits 120 and 110, as described above with reference to FIGS. 1B and 1C.

In this example, subcircuit 210 is assumed to be an optical subcircuit, and subcircuit 220 is assumed to be an analog subcircuit. Accordingly, because subcircuits 210 and 120 are both optical subcircuits, subcircuits 210 and 120 are grouped together to form subcircuit design block 230. Similarly, because subcircuits 220 and 110 are both analog circuits, subcircuit 220 and 110 are grouped together to form subcircuit design block 240.

Thereafter, as shown in FIG. 2C, subcircuit design block 230 is transformed into instantiable design subblock 235 by adding terminal C thereto, and subcircuit design block 240 is transformed into instantiable design subblock 245 by adding terminal A thereto. Subsequent to the transformation, instantiable design subblock 235 includes terminals $T_7$, $T_8$, C, $T_{12}$, and instantiable design subblock 245 includes terminals $T_9$, $T_{10}$, $T_{11}$, A. Terminals A and C enable data transfer between instantiable design blocks 235 and 245.

Figures 3A, 3B:
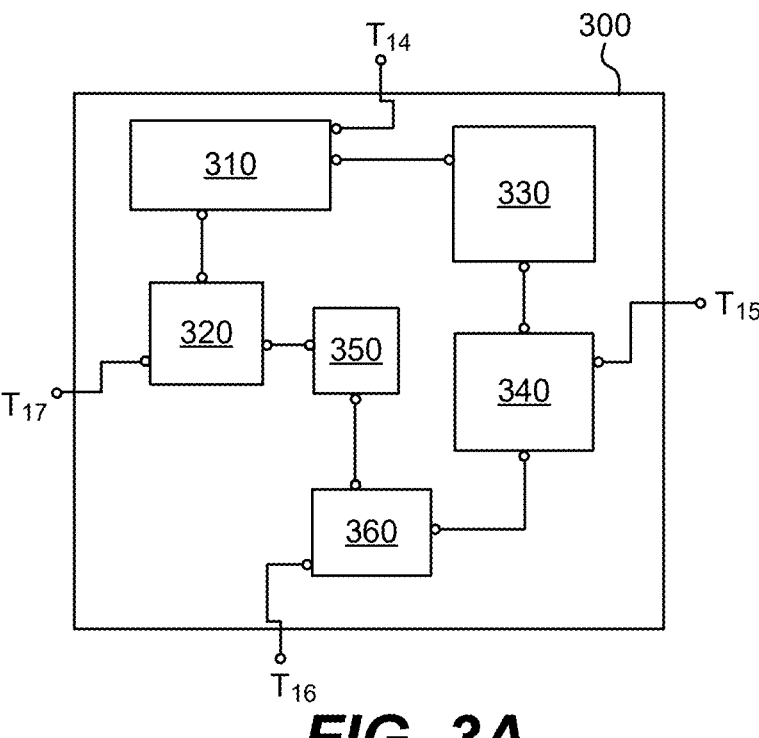
FIG. 3A shows an example of a circuit disposed at a level of a design hierarchy, in accordance with one embodiment of the present disclosure.
FIG. 3B shows the circuit of FIG. 3A after the circuit is divided into a number of subcircuits, in accordance with one embodiment of the present disclosure.

Circuits at other levels of a design hierarchy may also be divided, grouped and transformed into instantiable design blocks as described above with reference to the circuits shown in FIGS. 1A-1C and 2A-2C. FIG. 3A shows an example of a circuit 300 disposed in another level of the design hierarchy of which circuits 100 and 200 are parts of. Circuit 300 is shown as including subcircuits 310, 320, 330, 340, 350 and 360. Circuit 300 communicates with circuits at other levels of the design hierarchy via terminals $T_{14}$, $T_{15}$, $T_{16}$ and $T_{17}$. Terminals $T_{14}$, $T_{15}$, $T_{16}$ and $T_{17}$ are assumed to respectively transfer signals to and from subcircuits 310, 340, 360, and 320. Subcircuits 310 and 320 are assumed to be digital circuits that may be simulated using a digital circuit simulator. Subcircuits 330 and 340 are assumed to be analog circuits that may be simulated using an analog circuit simulator. Subcircuits 350 and 360 are assumed to be optical circuits that may be simulated using an optical circuit/component simulator.

Because subcircuits 310 and 320 are digital circuits, subcircuits 310 and 320 are grouped together to form design block 315, as shown in FIG. 3B. Because subcircuits 330 and 340 are analog circuits, subcircuits 330 and 340 are grouped together to form design block 335. Similarly, because subcircuits 350 and 360 are optical circuits, subcircuits 350 and 360 are grouped together to form design block 355.

Figures 3C, 3D:
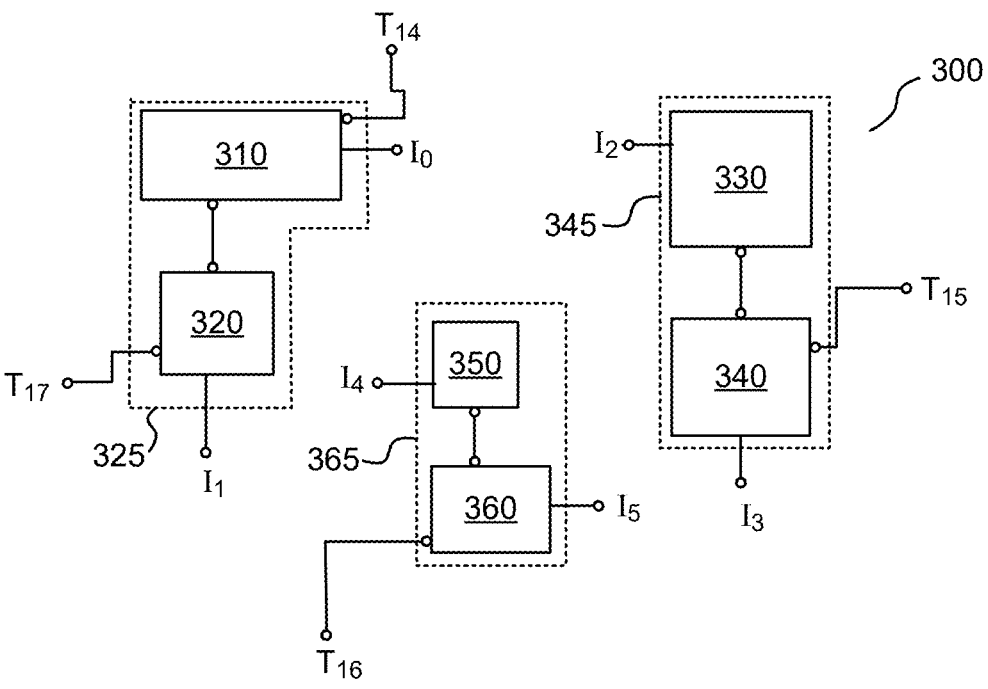
FIG. 3C shows the subcircuits of FIG. 3B after the subcircuits are transformed into instantiable design sub-blocks, in accordance with one embodiment of the present disclosure.
FIG. 3D shows the circuit of FIG. 3A after the circuit is divided into a number of subcircuits, in accordance with another embodiment of the present disclosure.

Thereafter, as shown in FIG. 3C, design block 315 is transformed into instantiable design subblock 325 by adding terminals $I_0$, $I_1$ $T_{14}$ and $T_{17}$ thereto, design block 335 is transformed into instantiable design subblock 345 by adding terminals $I_2$, $I_3$ and $T_{15}$ thereto, and design block 355 is transformed into instantiable design subblock 365 by adding terminals $I_4$, $I_5$ and $T_{16}$ thereto. Data transfer between instantiable design blocks 325 and 365 is carried out using terminals $I_1$ and $I_4$. Data transfer between instantiable design blocks 325 and 345 is carried out using terminals $I_0$ and $I_2$. Data transfer between instantiable design blocks 365 and 345 is carried out using terminals $I_3$ and $I_5$.

Assume subcircuit 360 is an optical LTI subcircuit. Therefore, in some embodiment, subcircuit 360 is transformed into an instantiable design subblock by adding terminals $I_5$ and $I_7$ thereto, and subcircuit 350 is transformed into an instantiable design subblock by adding terminals $I_4$ and $I_6$ thereto, as shown in FIG. 3D. Terminals $I_1$ and $I_4$ enable communications between instantiable design subblocks 325 and 350, and terminals $I_6$ and $I_7$ enable communications between instantiable design subblock 350 and 360. Instantiable design subblock 350 may be simulated using an optical simulator, and computations associated with instantiable design subblock 360 may be performed by a computation engine, as described above.

Referring concurrently to FIGS. 3A, 1B and 1C, if, for example, subcircuit 330 of circuit 300 is determined to be an instance of design block 100, then subcircuit 330 is replaced with instantiable design block 110 and 120 prior to the transformation of circuit 300. The process of traversing through the entire design hierarchy and replacing at each level of the hierarchy the subcircuits that have been transformed into instantiable design blocks is repeated until the subcircuits at all levels of the design hierarchy are replaced with their corresponding instantiable design blocks.

Figure 4:
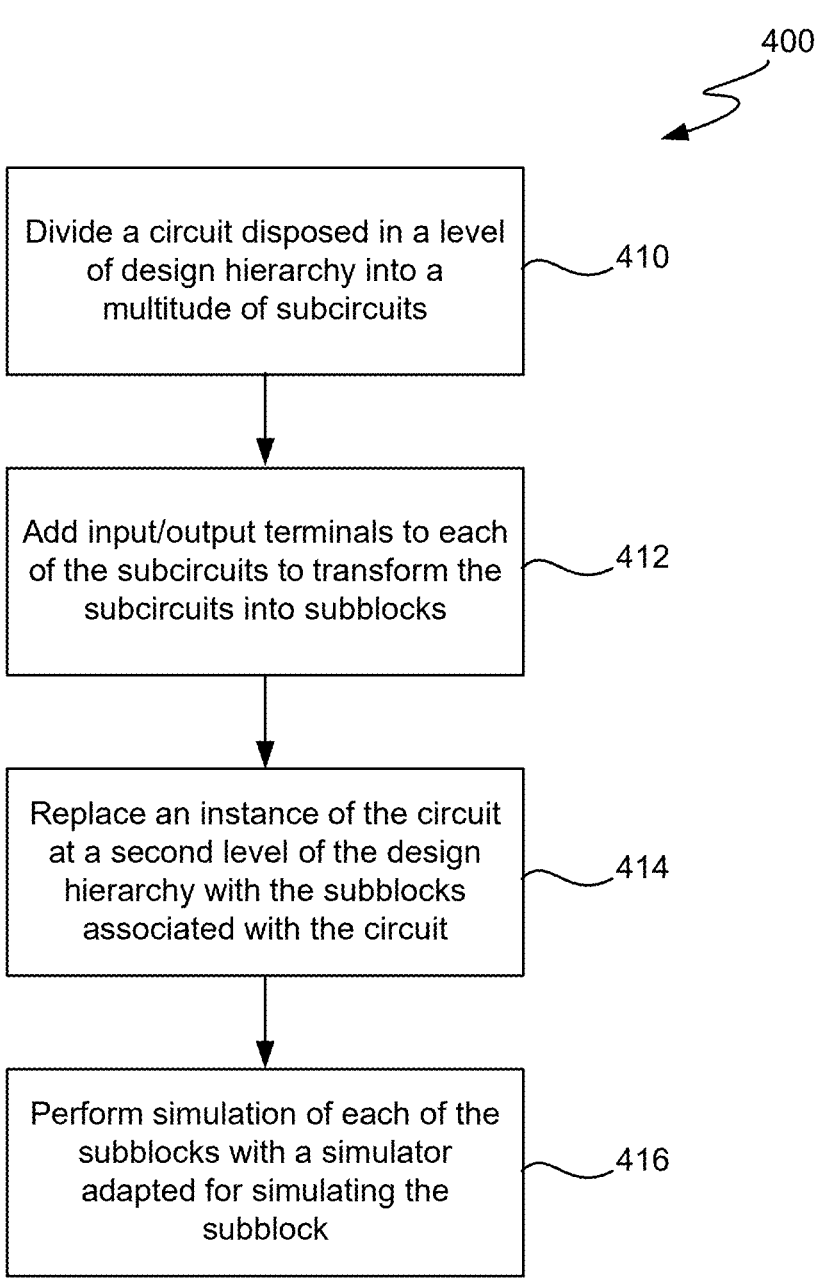
FIG. 4 shows a flowchart for performing simulation of a mixed-mode circuit design, in accordance with one embodiment of the present disclosure.

FIG. 4 is a flowchart 400 for simulating a mixed-mode circuit design, in accordance with one embodiment of the present disclosure. At 410, a circuit disposed in a level of the design hierarchy is divided into a multitude of subcircuits. At 412, input/output terminals are added to each of the subcircuits to transform the subcircuit into a subblock. At 414, any instance of the circuit at another level of the design hierarchy is replaced with the subblocks associated with the circuit. At 416, each subblock is simulated using a simulator adapted for simulating the subblock, as described in detail above.

Figure 5:
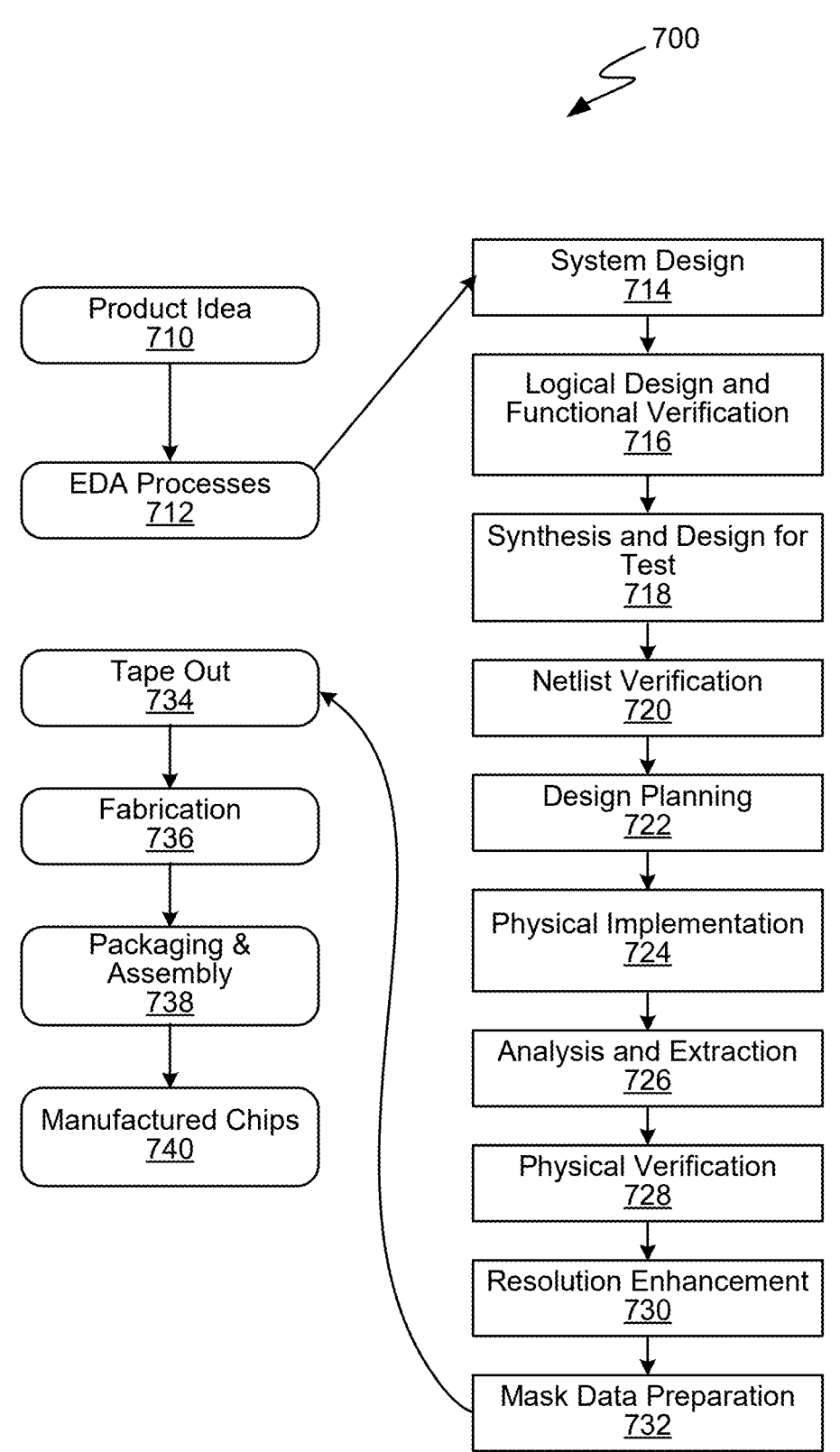
FIG. 5 depicts a flowchart of various processes used during the design and manufacture of an integrated circuit in accordance with some embodiments of the present disclosure.

FIG. 5 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level description may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 5. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 6) may be used to store the programs and data structures that are used by some or all of the EDA products described herein, and products used for development of cells for the library and for physical and logical design that use the library.

Figure 6:
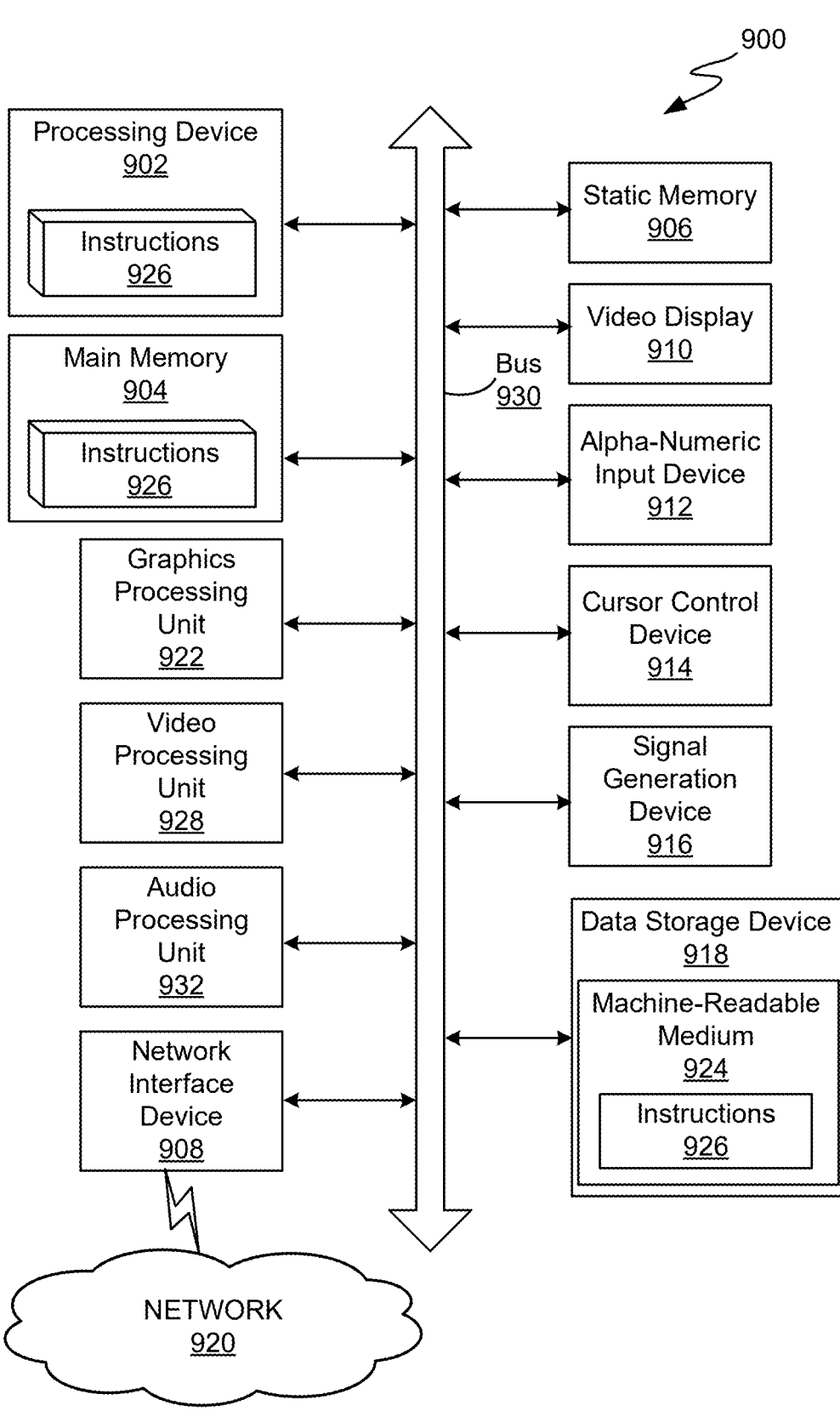
FIG. 6 depicts an example diagram of an example computer system in which embodiments of the present disclosure may operate.

FIG. 6 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, and the like.

The invention claimed is:

1. A method of simulating a mixed-signal circuit design, the method comprising:

dividing a first circuit design disposed in a first level of hierarchy of the mixed-signal circuit design into a plurality of subcircuits, wherein at least a first one of the plurality of subcircuits is adapted to process an electrical signal, and at a least a second one of the plurality of subcircuits is adapted to process an optical signal;

adding one or more input/output terminals to the first one of the plurality of subcircuits to transform the first one of the plurality of subcircuits into a first subblock;

adding one or more input/output terminals to the second one of the plurality of subcircuits to transform the second one of the plurality of subcircuits into a second subblock;

replacing, by a processing device, an instance of the first circuit design in a second level of hierarchy of the mixed-signal circuit design with the first and second subblocks;

performing a simulation of the first subblock associated with each of the first and second levels of the hierarchy using an electrical circuit simulator; and performing a simulation of the second subblock associated with each of the first and second levels of the hierarchy using an optical circuit simulator.

2. The method of claim 1 wherein at least a third one of the plurality of subcircuits of the first level of hierarchy is adapted to process an optical signal, the method further comprising:

disposing the third one of the plurality of subcircuits in the second subblock of the first level of hierarchy.

3. The method of claim 1 wherein the first one of the plurality of subcircuits is adapted to process an analog electrical signal, the method further comprising:

performing the simulation of the first subblock associated with each of the first and second levels of the hierarchy using an analog circuit simulator.

4. The method of claim 1 wherein the first one of the plurality of subcircuits is adapted to process a digital electrical signal, the method further comprising:

performing the simulation of the first subblock associated with each of the first and second levels of the hierarchy using a digital circuit simulator.

5. The method of claim 1 wherein the first one of the plurality of subcircuits is adapted to process an analog electrical signal, and wherein a third one of the plurality of subcircuits is adapted to process a digital electrical signal, the method comprising:

adding one or more input/output terminals to the third one of the plurality of subcircuits to transform the third one of the plurality of subcircuits into a third subblock;

replacing an instance of the first circuit design in a third level of hierarchy of the mixed-signal circuit design with the first, second and third subblocks;

performing a simulation of the first subblock associated with each of the first and third levels of the hierarchy using an analog circuit simulator;

performing a simulation of the second subblock associated with each of the first and third levels of the hierarchy using an optical circuit simulator; and performing a simulation of the third subblock in each of the first and third levels of the hierarchy using a digital circuit simulator.

6. The method of claim 1 further comprising:

traversing through the hierarchy of the mixed-signal circuit design in a descending order to perform the replacing.

7. The method of claim 1 wherein the first level of hierarchy is a highest level of the hierarchy of the mixed-signal circuit design.

8. A system for simulating a mixed-signal circuit design comprising, the system comprising:

a memory storing instructions; and a processor, coupled with the memory and to execute the instructions, the instructions when executed cause the processor to:

divide a first circuit design disposed in a first level of hierarchy of the mixed-signal circuit design into a plurality of subcircuits, wherein at least a first one of the plurality of subcircuits is adapted to process an electrical signal, and at a least a second one of the plurality of subcircuits is adapted to process an optical signal;

add one or more input/output terminals to the first one of the plurality of subcircuits to transform the first one of the plurality of subcircuits into a first subblock;

add one or more input/output terminals to the second one of the plurality of subcircuits to transform the second one of the plurality of subcircuits into a second subblock;

replace an instance of the first circuit design in a second level of hierarchy of the mixed-signal circuit design with the first and second subblocks;

perform a simulation of the first subblock associated with each of the first and second levels of the hierarchy using an electrical circuit simulator; and perform a simulation of the second subblock associated with each of the first and second levels of the hierarchy using an optical circuit simulator.

9. The system of claim 8 wherein at least a third one of the plurality of subcircuits of the first level of hierarchy is adapted to process an optical signal, wherein the instructions further cause the processor to:

dispose the third one of the plurality of subcircuits in the second subblock of the first level of hierarchy.

10. The system of claim 8 wherein the first one of the plurality of subcircuits is adapted to process an analog electrical signal, wherein the instructions further cause the processor to:

perform the simulation of the first subblock associated with each of the first and second levels of the hierarchy using an analog circuit simulator.

11. The system of claim 8 wherein the first one of the plurality of subcircuits is adapted to process a digital electrical signal, wherein the instructions further cause the processor to:

perform the simulation of the first subblock associated with each of the first and second levels of the hierarchy using a digital circuit simulator.

12. The system of claim 8 wherein the first one of the plurality of subcircuits is adapted to process an analog electrical signal, and wherein a third one of the plurality of subcircuits is adapted to process a digital electrical signal, wherein the instructions further cause the processor to:

add one or more input/output terminal to the third one of the plurality of subcircuits to transform the third one of the plurality of subcircuits into a third subblock;

replace an instance of the first circuit design in a third level of hierarchy of the mixed-signal circuit design with the first, second and third subblocks;

perform a simulation of the first subblock associated with each of the first and third levels of the hierarchy using an analog circuit simulator;

perform a simulation of the second subblock associated with each of the first and third levels of the hierarchy using an optical circuit simulator; and perform a simulation of the third subblock in each of the first and third levels of the hierarchy using a digital circuit simulator.

13. The system of claim 8, wherein the instructions further cause the processor to:

traverse through the hierarchy of the mixed-signal circuit design in a descending order to perform the replacement.

14. The system of claim 8 wherein the first level of hierarchy is a highest level of the hierarchy of the mixed-signal circuit design.

15. A non-transitory computer readable medium comprising stored instructions, which when executed by a processor, cause the processor to:

divide a first circuit design disposed in a first level of hierarchy of the mixed-signal circuit design into a plurality of subcircuits, wherein at least a first one of the plurality of subcircuits is adapted to process an electrical signal, and at a least a second one of the plurality of subcircuits is adapted to process an optical signal;

add one or more input/output terminals to the first one of the plurality of subcircuits to transform the first one of the plurality of subcircuits into a first subblock;

add one or more input/output terminals to the second one of the plurality of subcircuits to transform the second one of the plurality of subcircuits into a second subblock;

replace an instance of the first circuit design in a second level of hierarchy of the mixed-signal circuit design with the first and second subblocks;

perform a simulation of the first subblock associated with each of the first and second levels of the hierarchy using an electrical circuit simulator; and perform a simulation of the second subblock associated with each of the first and second levels of the hierarchy using an optical circuit simulator.

16. The non-transitory computer readable medium 15 wherein at least a third one of the plurality of subcircuits of the first level of hierarchy is adapted to process an optical signal, wherein the instructions further cause the processor to:

dispose the third one of the plurality of subcircuits in the second subblock of the first level of hierarchy.

17. The non-transitory computer readable medium 15 wherein the first one of the plurality of subcircuits is adapted to process an analog electrical signal, wherein the instructions further cause the processor to:

perform the simulation of the first subblock associated with each of the first and second levels of the hierarchy using an analog circuit simulator.

18. The non-transitory computer readable medium 15 wherein the first one of the plurality of subcircuits is adapted to process a digital electrical signal, wherein the instructions further cause the processor to:

perform the simulation of the first subblock associated with each of the first and second levels of the hierarchy using a digital circuit simulator.

19. The non-transitory computer readable medium 15 wherein the first one of the plurality of subcircuits is adapted to process an analog electrical signal, and wherein a third one of the plurality of subcircuits is adapted to process a digital electrical signal, wherein the instructions further cause the processor to:

add one or more input/output terminal to the third one of the plurality of subcircuits to transform the third one of the plurality of subcircuits into a third subblock;

replace an instance of the first circuit design in a third level of hierarchy of the mixed-signal circuit design with the first, second and third subblocks;

perform a simulation of the first subblock associated with each of the first and third levels of the hierarchy using an analog circuit simulator;

perform a simulation of the second subblock associated with each of the first and third levels of the hierarchy using an optical circuit simulator; and perform a simulation of the third subblock in each of the first and third levels of the hierarchy using a digital circuit simulator.

20. The non-transitory computer readable medium 15, wherein the instructions further cause the processor to:

traverse through the hierarchy of the mixed-signal circuit design in a descending order to perform the replacement.

\* \* \* \* \*